United States Patent [19]
Lin et al.

[11] Patent Number: 5,640,347
[45] Date of Patent: Jun. 17, 1997

[54] EEPROM CIRCUIT CONFIGURATION HAVING SECURITY FUNCTION

[75] Inventors: Yi-Pin Lin; Tsen Shau Yang, both of Hsin-chu, Taiwan

[73] Assignee: Myson Technology, Inc., Taiwan

[21] Appl. No.: 550,506

[22] Filed: Oct. 30, 1995

[51] Int. Cl.⁶ .................................................. G11C 11/34
[52] U.S. Cl. .................. 365/185.04; 365/185.26; 365/185.29; 365/185.33
[58] Field of Search .................... 365/185.04, 185.26, 365/185.29, 185.33, 226

[56] References Cited

U.S. PATENT DOCUMENTS 4,962,484  10/1990  Takeshima et al. ................ 365/226

*Primary Examiner*—David C. Nelms
*Assistant Examiner*—Trong Quang Phan
*Attorney, Agent, or Firm*—Cushman Darby & Cushman IP Group of Pillsbury Madison & Sutro LLP

[57] ABSTRACT

The present invention provides a security configuration of EEPROM, which is adaptable to a semiconductor integrated circuit. Each byte or minimum cell of the EEPROM is assigned a security bit which corresponds to the same memory cell of EEPROM in a data memory array. Since the security bit can be established inside the memory array, necessary chip area is not increased significantly.

6 Claims, 6 Drawing Sheets

Source (S) : ground

Gate (G) : VPP

Drain (D) : ground

Source (S) : floating

Gate (G) : ground

Drain (D) : VPP

Normal mode

| programmed bit | security bit value | security bit | data bit |
|---|---|---|---|
| data bit | 0* | Fig. 6 | Fig. 6 |
| security bit** | 0* | Fig. 6 | Fig. 6 |
| data bit | 1 | Fig. 4 | Fig. 3 |
| security bit** | 1 | Fig. 5 | Fig. 6 |

\* When security bit is 0, data bit cannot be changed (security mode).

\*\* Program security bit makes the value of security bit become 0.

Figure 9

Test mode

| programmed bit | security bit value | security bit | data bit |
|---|---|---|---|
| data bit | 0* | Figure 3 | Figure 3 |
| security bit | 0* | Figure 3 | Figure 3 |
| data bit | 1 | Figure 3 | Figure 3 |
| security bit | 1 | Figure 3 | Figure 3 |

\* When security bit is 0, data bit may be changed.

Figure 10

EEPROM CIRCUIT CONFIGURATION HAVING SECURITY FUNCTION

BACKGROUND OF THE INVENTION

1. Field of the Invention

The present invention relates to a semiconductor integrated circuit EEPROM. More particularly, the present invention relates to an EEPROM circuit and the design thereof having security functions. The EEPROM circuit disclosed in the invention is provided with unique security functions. In particular, security functions can be assigned for a specific byte, word, a portion of a byte, or a portion of a word. Furthermore, the present invention provides security configurations for an EEPROM which can be incorporated in small spaces.

2. Background Art

EEPROM (Electrically Erasable Programmable ROM) is a kind of non-volatile memory usually utilized in circuit design. The content of memory may be kept automatically even when a power supply for the EEPROM is switched off abruptly. Generally, EEPROM is used for storing important information, like configuration or password data. As for other applications, for example, read-only memory in which a "write" function is unnecessary or prohibited, the corresponding EEPROM must be set to be under "security" mode. Furthermore, for some systems the content of memory may be re-written because of erroneous operations. In general, while switching on the power supply of a system in which EEPROM is included, different power-on reset voltages may be set for each chip respectively. Under the circumstances, the input ends of the corresponding EEPROM may receive undesirable noises and lead to erroneous operations, i.e. executing a "write" operation. Erroneous data are therefore stored in the EEPROM.

To solve this problem, it has been proposed to establish, in corresponding EEPROMs, separate security circuits which can provide security for all memory cells of the EEPROMs. However, since such a security circuit can provide security only for all or none of the memory cells, it apparently does not satisfy general requirements in application. If it is desirable to provide individual security only for a portion of memory or for each memory cell by the afore-described technique, the corresponding circuit design may become very complicated, thus leading to high cost and significant chip area.

Therefore, it is necessary to provide a security configuration for EEPROM memory circuits by which security functions for any specific memory cells are possible. It is also necessary to provide a simple and compact security configuration for specific memory cells or bytes of an EEPROM.

DISCLOSURE OF INVENTION

It is the principal object of the present invention to provide an EEPROM circuit having security functions which offers security for any specific memory cells of the EEPROM circuit.

It is another object of the present invention to provide a new design of EEPROM circuit to accomplish the above object.

It is yet another object of the present invention to provide a memory configuration in which users can randomly fetch read-only or read/write data from any partition of a memory configuration.

It is yet another object of the present invention to provide an EEPROM circuit in which complicated circuit design and significant chip area is not necessary.

SUMMARY OF THE INVENTION

The present invention provides a security configuration of EEPROM, which is adaptable to semiconductor integrated circuits. Each byte or minimum cell of the EEPROM may be assigned a security bit which corresponds to the same memory cell of EEPROM in a data memory array. Since the security bit can be established inside the memory array, chip area is not increased significantly. In the embodiment of the present invention, security of each data byte (word) is accomplished by use of a security bit. When a security bit is set to be "active", the content of the byte (word) can not be written even if program releases "write" instructions. Concerning circuit design, operations on the security bit of the present invention is unidirectional for users. Specifically, when memory is to be used, the security bits must have been reset from the beginning. While using the memory, the corresponding byte (word) needs to be secured, which is accomplished by setting a "security" mode by programming. In the present invention, a session for reading the security bit is established during each execution cycle so as to determine whether the corresponding byte (word) can be written. Under the security mode, high-voltage, which may re-write the content of the byte (word), will not be introduced into the byte (word).

BRIEF DESCRIPTION OF THE DRAWINGS

The above mentioned and other objects and features of the present invention and the manner of attaining them will become apparent, and the invention itself will be best understood by reference to the following description of the invention in conjunction with the accompanying drawings, wherein:

FIG. 9 is a table showing operations in reading, writing or erasing cycles during a normal mode of an EEPROM circuit having security functions according to the present invention.

FIG. 10 is a table showing the operations in reading or erasing cycles during a test mode of an EEPROM circuit having security functions according to the present invention.

DETAILED DESCRIPTION OF THE PREFERRED EMBODIMENT

Figure 1:
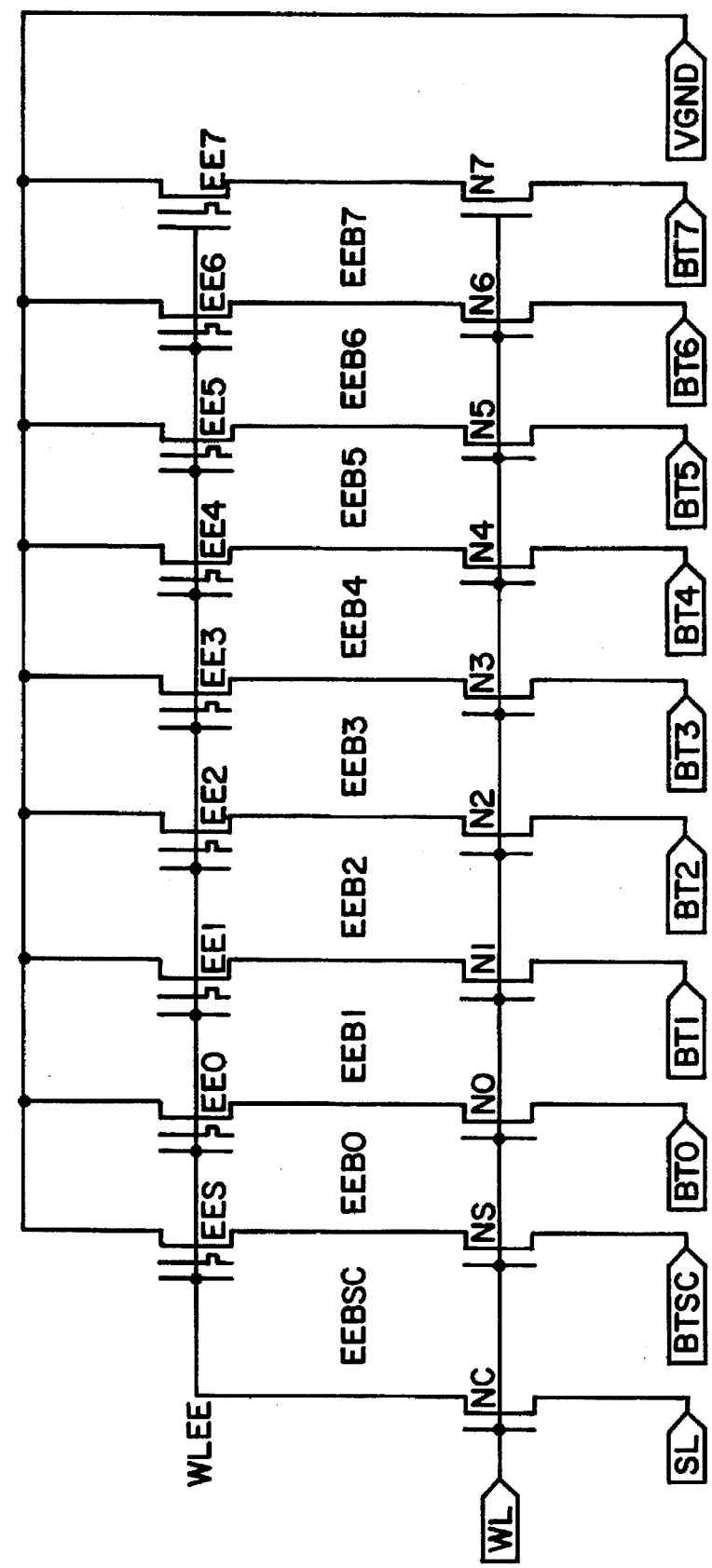
FIG. 1 is a one-byte circuit diagram of an EEPROM circuit having security functions according to the present invention.

Referring to FIG. 1, a one-byte circuit diagram of an EEPROM circuit having security functions according to the present invention is shown. The byte includes: a control bit NMOS NC; security bits NMOS EES and NMOS NS; and bits which altogether represent one-byte data: EE0, N0; EE1, N1; EE2, N2; EE3, N3; EE4, N4; EE5, N5; EE6, N6; EE7, N7. As can be seen, security bits and data bits EEBSC and EEB0 . . . EEB7 each include two NMOS transistor.

As shown in FIG. 1, the control gates of the NMOS transistors EES and EE0. . . EE7 are all commonly connected via a word line portion WLEE. The gates of the NMOS transistors NC, NS and N0. . . N7 are all commonly connected to a terminal WL. The control bit NMOS NC operatively connects the word line portion WLEE to the terminal SL. The sources of the NMOS transistors EES and EE0. . . EE7 are all commonly connected to terminal VGND, while their drains are operatively connected to respective terminals BTSC and BT0. . . BT7 via transistors NS and N0. . . N7.

Figure 2:
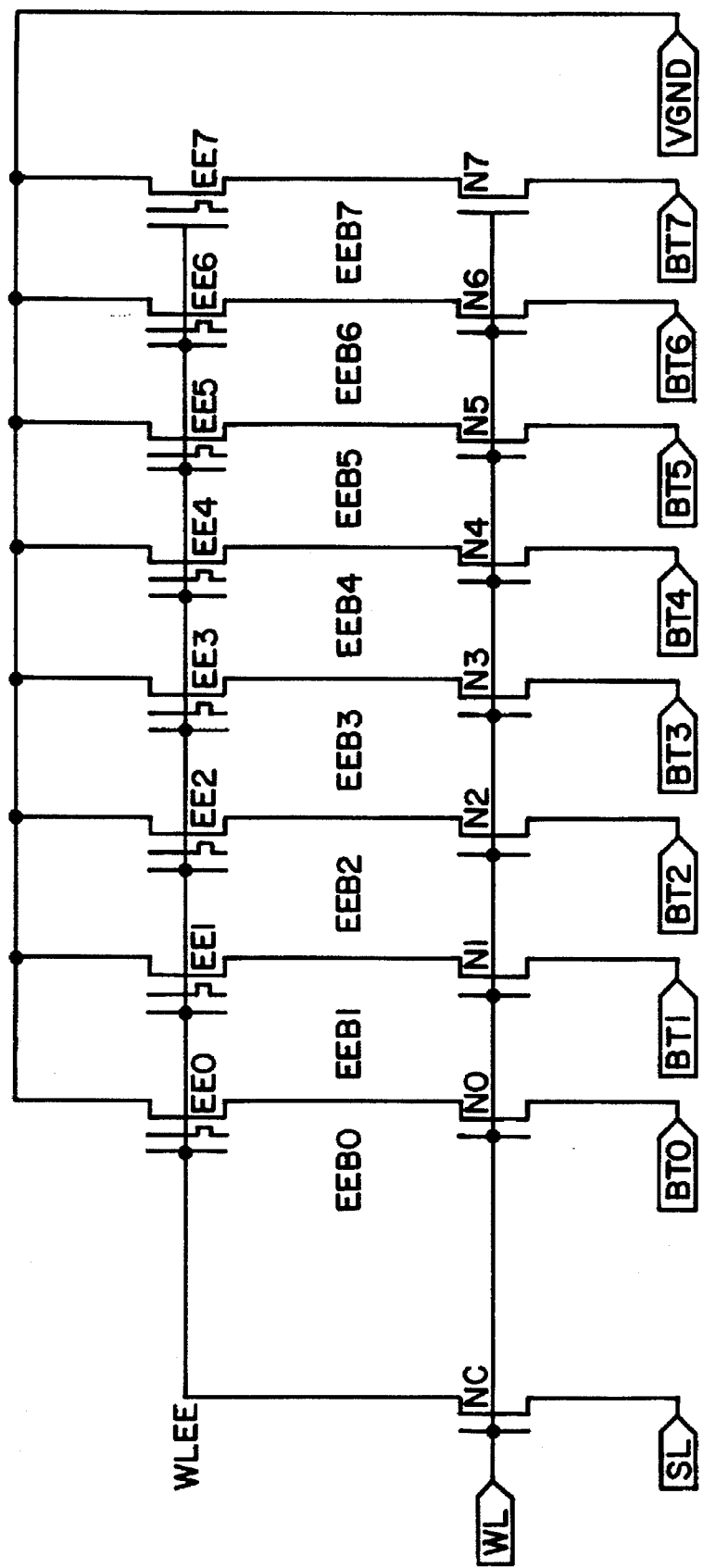
FIG. 2 is a one-byte circuit diagram of a conventional EEPROM circuit.

On the other hand, a one-byte circuit diagram of a conventional EEPROM circuit is shown in FIG. 2. The main difference between the conventional one-byte circuit which has no security function and the one-byte circuit of the present invention lies in that the conventional circuit is not provided with security bits EES and NS. For other portions, these two circuits are very similar.

The circuit shown in FIG. 1 is adaptable to a one-byte case. However, it is also feasible to establish a security bit for each memory cell which represents a word (not necessarily 8-bits) of EEPROM. The most significant merit of the present invention is that because security can be accomplished by merely establishing an additional security bit in the conventional circuit, complicated security circuits are not necessary.

Figure 3:
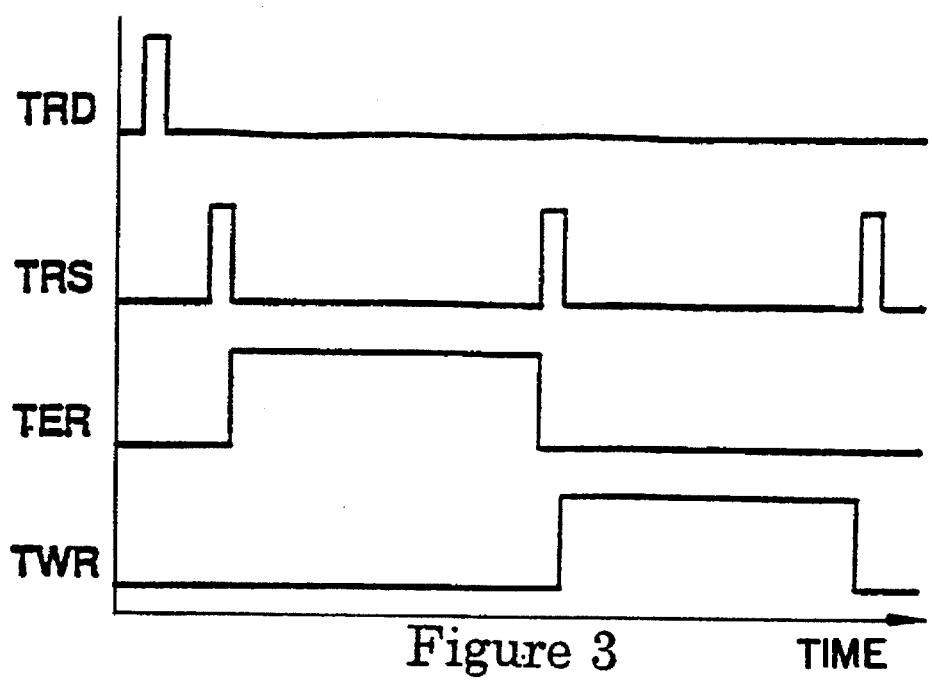
FIG. 3 is a timing diagram of an erasable and writable mode of an EEPROM circuit having security functions according to the present invention.

In the embodiment of the present invention, special automatic control timing is utilized to implement security functions of the above-described circuit. Referring to FIG. 3, a timing diagram of an erasable and writable mode of an EEPROM circuit having security functions according to the present invention is shown. In the timing diagram, the control operations of the EEPROM circuit according to the present invention includes the following four control cycles: a security-bit-read cycle (TRD); a three-stages reset cycle (TRS); an erase cycle (TER); and a write cycle (TWR).

Figure 4:
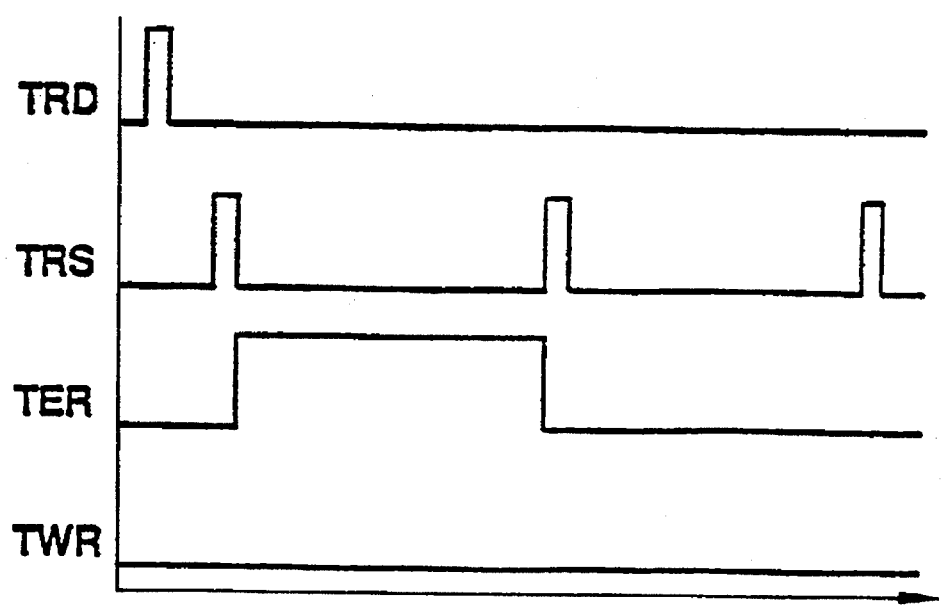
FIG. 4 is a timing diagram of an erasable and un-writable mode of an EEPROM circuit having security functions according to the present invention.
Figure 5:
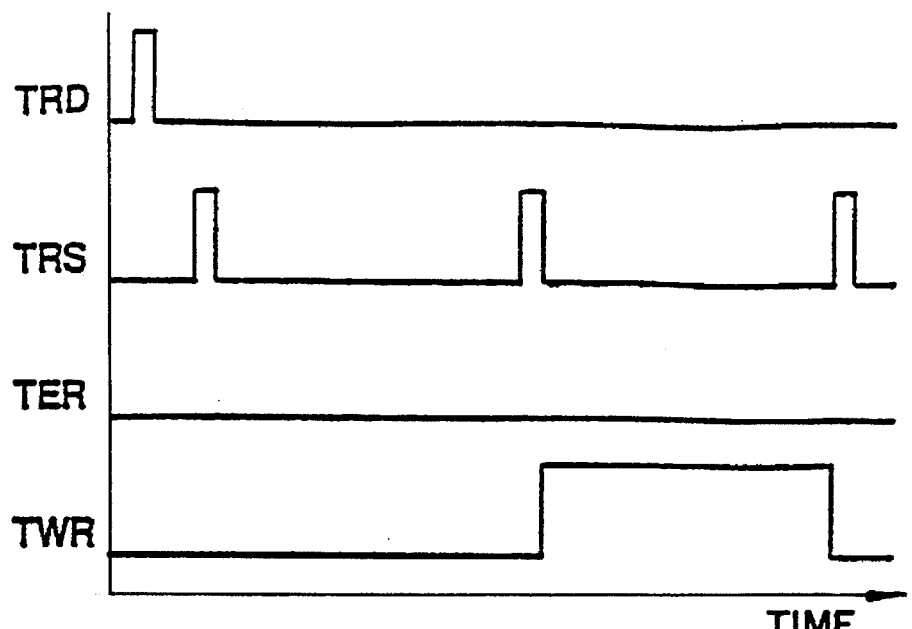
FIG. 5 is a timing diagram of an un-erasable and writable mode of an EEPROM circuit having security functions according to the present invention.
Figure 6:
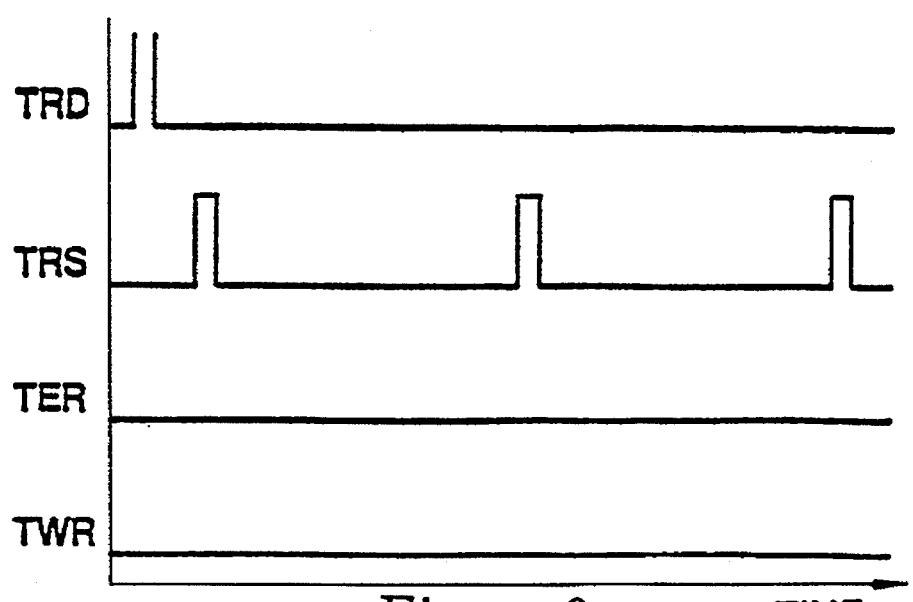
FIG. 6 is a timing diagram of a security mode, i.e. an un-erasable and un-writable mode, of an EEPROM circuit having security functions according to the present invention.

High-voltage VPP is produced inside or introduced from outside, which provides a high electric field while TER=1 or TWR=1. In a TER or TWR cycle, electric charges move backward and forward in the thin oxide channel owing to the tunneling effect such that an erasing or writing operation is accomplished. Prior to the voltage VPP being produced, the system reads the content of the security bit in TRD cycle, then it determines an adequate processing timing according to the security bit data and bit addresses to be processed. Referring to FIGS. 4, 5 and 6, some other control timings according to different Security modes and different data bits or security bits to be processed are shown. Depending on different purposes, the system automatically chooses an adequate timing. Furthermore, the charges in all wordlines or bitlines will be cleared before inputting the VPP signal or after outputting the VPP signal during TRS cycle, thus eliminating undesirable disturbances.

Figure 7:
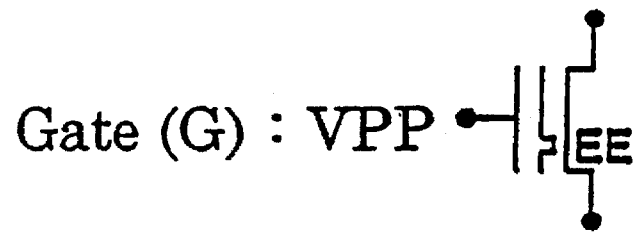
FIG. 7 is a schematic diagram of a circuit signal in an erasing cycle of an EEPROM circuit having security functions according to the present invention.
Figure 8:
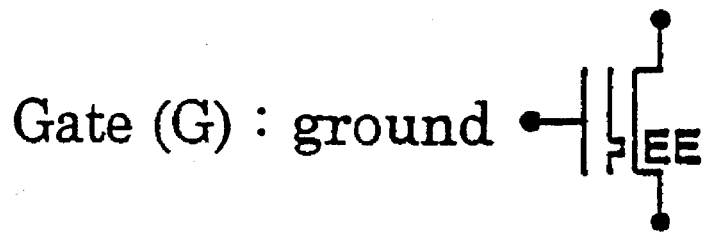
FIG. 8 is a schematic diagram of a circuit signal in a writing cycle of an EEPROM circuit having security functions according to the present invention.

Referring to FIGS. 7 and 8, schematic diagrams of circuit signals in erasing and writing cycles of an EEPROM circuit having security functions according to the present invention are shown respectively.

Data of a one-byte memory cell can be erased as follows. First, electrons are made to penetrate into the floating gate, and a threshold voltage is thus raised. The corresponding data under the situation is defined to be "1". To attain this situation, the gate voltage of an NMOS EE is set to be VPP, and the drain and source are both grounded, as shown in FIG. 7.

Data of a memory cell can be written as follows. First, electrons in the floating gate are removed, and a threshold voltage is thus lowered. The corresponding data under the situation is defined to be "0". To attain this situation, the gate voltage of an NMOS EE is grounded, and the drain and source are set to be VPP and floating respectively, as shown in FIG. 8.

Referring again to FIGS. 1 and 2, the gate of each NMOS EE is connected with each other while data processing is executed byte-by-byte. In the present invention as illustrated in FIG. 1, this means that if a security bit or a data bit is erased, all the data bits and security bits in the same byte (word) will be erased simultaneously. However, when the voltage VPP is applied at the drain of an NMOS EE, the contents of the corresponding security bit and data bit for each bitline can be rewritten. The following embodiment is used to illustrate these operations.

Referring to FIG. 9, a table showing operations in reading, writing or erasing cycles under normal mode of an EEPROM circuit according to the present invention is shown. A one-byte data (Assuming it is "00111010") can be transformed into "01010101" as follows. First, the security bit value of the address is read during TRD cycle. If the value read is determined to be "0", then the cycle shown in FIG. 6 begins. Erasing and writing operations are both prohibited under the situation. Writing into the security bit or the data bit is also prohibited. In other words, the byte is under security mode.

If the security bit read during TRD cycle is determined to be "1", then the cycle shown in FIG. 3 begins. Data bits combination value "00111010" is first transformed into "11111111" during TER cycle, then "11111111" is transformed into "01010101" during TWR cycle and the operation ends. Please note that the above writing operation does not change the value of security bit, as shown in FIG. 4. Specifically, though the content of security bit was set to be "1" during TER cycle, since it had been "1" before being set, it indeed remains unchanged during this process.

As other examples, suppose security bit is to be programmed with the data bit kept unchanged under normal mode, then a data bit with a timing diagram as shown in FIG. 6 should be used, in which writing and erasing operations do not occur. Furthermore, suppose security bit is to be transformed into "1" from "0", then security will be invalidated, which is prohibited. Therefore, the timing diagram as shown in FIG. 6 should be used. Similarly, where "0" is to be transformed into "0", the timing diagram of FIG. 6 should also be used. Suppose security bit is to be transformed into "0" from "1", or into "1" from "1", then the timing diagram as shown in FIG. 5 should be used. Data can be written only when TWR works and TER does not work.

The operations of the two examples in the previous paragraph are listed in the table of FIG. 9. All possible operations under normal mode are included in that table.

Specifically, the table gives a detailed comparison list about how the system selects automatic control timing according to various program instructions environments under normal mode. However, some modifications may be necessary in practical applications. Moreover, since the change of security bit in this case is unidirectional, a complete test about the security bit is not possible in a production process. Therefore, a test mode needs to be added in addition to normal mode to ensure correct execution. Under the test mode, if the security bit is not secured, the value of the security bit should be bidirectional. In other words, it can be transformed into "1" from "0" or into "0" from "1". In this way, a complete test of performances about the security bit can be ensured. Referring to FIG. 10, a comparison list of adequate timings of the present invention under test mode is shown. By utilizing the test mode, the correctness of test results can be ensured and re-use of chips become possible. Apparently, there should be some proper conditions to control if a system can enter the test mode.

Therefore, the EEPROM circuit having security functions according to the present invention provides direct security for each minimum memory cell by assigning a security bit to each conventional EEPROM memory cell with the aid of a special control approach.

While particular embodiments of the present invention have been disclosed, it is to be understood that the invention need not be limited to the disclosed embodiments. On the contrary, it is intended to cover various different modifications within the spirit and scope of the appended claims, the scope of which should be accorded the broadest interpretation so as to encompass all such modifications.

What is claimed is:

1. A memory circuit, comprising:

a plurality of memory cells, each memory cell being used for memorizing a memory signal;

at least one security cell for memorizing a security signal;

a control unit for controlling erasing and writing operations of said plurality of memory cells and said security cell;

an erasing means for re-writing said memory signals of selected cells of said plurality of memory cells and said security signal of said security cell to become a first signal;

a writing means for re-writing said memory signals of selected cells among said plurality of memory cells and said security signal of said security cell to become a second signal;

a determining means for determining if erasing and/or writing operations is active according to said security signal of said security cell.

2. A circuit according to claim 1, wherein both said security cell and each of said plurality of memory cells include two NMOS (N-channel Metal-Oxide-Semiconductor) transistors.

3. A circuit according to claim 1 or 2, wherein said determining means determines that both said erasing means and said writing means are not active if said security signal memorized in said security cell is said second signal.

4. A portion of a nonvolatile memory comprising:

at least one memory cell having a control portion and a storage portion, said storage portion containing memory data;

at least one security cell having a control portion and a storage portion said storage portion containing security data; and a control unit commonly coupled to said control portions of said memory cell and said security cell, said control unit controlling erasing and writing operations of said memory cell and said security cell in accordance with said security data contained in said security cell.

5. A nonvolatile memory portion according to claim 4, further comprising:

writing means for writing said storage portions of selected ones of said memory cell and said security cell, said writing means being coupled to said control unit and to said storage portions of said memory cell and said security cell; and erasing means for erasing said storage portions of selected ones of said memory cell and said security cell, said erasing means being coupled to said control unit and to said storage portions of said memory cell and said security cell.

6. A portion of a nonvolatile memory, comprising:

at least one memory cell including a memory transistor and a control transistor, said memory transistor having a control gate, a floating gate, a source and a drain, said source being connected to a voltage terminal, said control transistor of said memory cell being connected between said drain of said memory transistor and a first bit terminal, and having a gate connected to a control terminal;

at least one security cell including a memory transistor and a control transistor, said memory transistor having a control gate, a floating gate, a source and a drain, said source being connected to said voltage terminal, said control transistor of said security cell being connected between said drain of said memory transistor and a second bit terminal, and having a gate connected to said control terminal, a security mode of said portion of said nonvolatile memory being determined in accordance with a state of said floating gate of said memory transistor of said security cell; and a control unit including a MOS transistor, said MOS transistor being commonly connected between said control gates of said memory transistors of said memory cell and said security cell and a programming terminal, and having a gate connected to said first control terminal.

* * * * *